United States Patent
Lee et al.

(10) Patent No.: US 7,113,436 B2
(45) Date of Patent: Sep. 26, 2006

(54) SENSE AMPLIFYING CIRCUIT FOR A SEMICONDUCTOR MEMORY WITH IMPROVED DATA READ ABILITY AT A LOW SUPPLY VOLTAGE

(75) Inventors: Seung-hoon Lee, Suwon (KR); Jae-yoon Sim, Suwon (KR)

(73) Assignee: Samsung Electronics Co., Ltd., (KR)

( * ) Notice: Subject to any disclaimer, the term of this patent is extended or adjusted under 35 U.S.C. 154(b) by 120 days.

(21) Appl. No.: 10/731,841

(22) Filed: Dec. 9, 2003

(65) Prior Publication Data
US 2004/0227543 A1 Nov. 18, 2004

(30) Foreign Application Priority Data
Dec. 13, 2002 (KR) ................ 10-2002-0079634

(51) Int. Cl.
*G11C 7/02* (2006.01)
(52) U.S. Cl. .............. 365/207; 365/208; 365/189.01
(58) Field of Classification Search ............ 365/206, 365/207, 208, 189.01
See application file for complete search history.

(56) References Cited
U.S. PATENT DOCUMENTS 4,943,944 A * 7/1990 Sakui et al. ........... 365/189.05
5,077,689 A * 12/1991 Ahn ........................ 365/201

* cited by examiner

*Primary Examiner*—Richard Elms
*Assistant Examiner*—Pho M. Luu
(74) *Attorney, Agent, or Firm*—F. Chau & Associates, LLC

(57) ABSTRACT

Provided is a circuit for use in a semiconductor memory optimized to improve data read ability at low supply voltages. Circuit includes a direct sense AMP circuit, an input/output gate circuit, and an operation control unit. The direct sense AMP circuit transmits read data loaded in a bit line pair including first and second bit lines to a data input/output pair including first and second data input/output lines in response to a read command signal. The input/output gate circuit which, in response to a read/write signal, also passes the read data loaded in the bit line pair directly to the data input/output line pair, and passes write data loaded in the data input/output line pair directly to the bit line pair. The operation control unit which, in response to a column address signal and a write command, generates the read command signal and the read/write signal to turn ON both the direct sense AMP circuit and the input/output gate circuit in a data read operation, or to turn ON the input/output gate circuit and turn OFF the direct sense AMP circuit in a data write operation.

26 Claims, 6 Drawing Sheets

SENSE AMPLIFYING CIRCUIT FOR A SEMICONDUCTOR MEMORY WITH IMPROVED DATA READ ABILITY AT A LOW SUPPLY VOLTAGE

BACKGROUND OF THE INVENTION

1. Field of the Invention

The present invention relates to semiconductor memories (e.g., RAM or ROM memories), and more particularly, to a bit line sense amplifying circuit for use in a semiconductor memory for effectively transmitting or receiving data from a bit line pair to an input/output line pair in a data read or write operation at a low supply voltage level.

2. Description of the Related Art

Recently, semiconductor memories requiring only a low supply voltage level have been popularized. As the supply voltage level of the semiconductor memories becomes lower, data sensed from a memory cell is transmitted from a bit line pair to an input/output line pair under the influence of the lowered supply voltage. At these lower voltages, the resistance to current between the bit line pair and the input/output line pair has a greater affect upon the performance of the memories.

FIG. 1 is a circuit diagram of a conventional circuit including a direct sense AMP that connects a data input/output pair to a bit line pair.

Referring to FIG. 1, a first bit line BL is connected to a second data output line RIOB through a transistor TR3 of a direct sense AMP 150. A second bit line BLB is connected to a first data output line RIO through a transistor TR2 of the direct sense AMP 150.

The first bit line BL is connected to a first data input line WIO through a transistor TR4, and the second bit line BLB is connected to a second data input line WIOB through a transistor TR5.

In a data read operation, if a column address signal CAS and a write command WR are at a high level, a read command signal CSLR is applied to the transistor TR1 at a high level, and thus the Sense AMP 150 is activated, and the transistor TR1 is turned ON (meaning active, conducting current). At least one of the Sense Amp transistors TR2 or TR3 detects the minute voltage signal on its respective bit line (BL or BLB) and "amplifies" it. Then, data in the bit line pair (BL and BLB) is output to first and second output lines (RIO and RIOB). In a data read operation, a write signal CSLW becomes low, and thus the transistors TR4 and TR5 are turned OFF.

In a data write operation, if the column address signal CAS is at a high level, and the write command WR is at a low level, the read command signal CSLR becomes low and is applied to the transistor TR1, and thus the transistor TR1 is turned OFF. Therefore, the direct sense AMP 150 does not operate. The write signal CSLW becomes high, and thus the transistors TR4 and TR5 are turned ON. Then, data is input to the bit line pair BL and BLB through the first and second data input lines WIO and WIOB.

In FIG. 1, a data output line pair (RIO and RIOB) and the data input line pair (WIO and WIOB) are separate from each other.

FIG. 2 is a circuit diagram of another conventional circuit including a sense AMP that connects a data input/output line pair to a bit line pair.

A circuit 200 of FIG. 2 has the same configuration as a circuit 100 of FIG. 1 except that it has a data input/output line pair DIO and DIOB where the data output line pair RIO and RIOB and the input line pair WIO and WIOB of FIG. 1 are directly connected to each other.

Similarly to the circuit 100 of FIG. 1, in a data read operation, the transistor TR1 is turned ON, and the transistors TR4 and TR5 are turned OFF. Thus, data of the bit line pair BL and BLB is output to the data input/output pair DIO and DIOB.

In a data write operation, the transistor TR1 is turned OFF, and the transistors TR4 and TR5 are turned ON. Thus, external data is input to the bit line pair BL and BLB through the data input/output line pair DIO and DIOB.

However, in the data read operation involving the conventional sense AMPs (150 and 250) of FIGS. 1 and 2, only the read command signal CSLR is activated, and data amplified by sense AMPs (150 and 250) is transmitted to the data input/output pair DIO and DIOB. In the data write operation, only the write signal CSLW is activated, and external data input from DIO and DIOB through the transistors TR4 and TR5 is transmitted to the bit line pair BL and BLB.

Since only the read command signal CSLR is activated in the data read operation, the data input/output line pair DIO and DIOB are affected by only the sense AMPs 150 and 250. During the data read operation the data lines extending between the bit line pair BL and BLB and the transistors TR4 and TR5 respectively, are electrically disconnected from the data input/output line pair DIO and DIOB by transistors TR4 and TR5 in the OFF state. Thus, the data input/output line pair DIO and DIOB is not affected by the data lines extending between the bit line pair BL and BLB and the transistors TR4 and TR5 respectively.

Therefore, if the sense AMP 250 alone is activated for a data read operation in the semiconductor circuit of FIG. 2 whose supply voltage level is low, it is difficult (e.g., slow) to execute the data read operation.

SUMMARY OF THE INVENTION

The present invention provides a circuit which is adapted to performing a data read operation while a supply voltage level is low by activating both a data transmission line and a data write line of a direct sense AMP during the data read operation.

According to an aspect of the present invention, there is provided a circuit that comprises a direct sense AMP circuit, an input/output gate circuit, and an operation control unit. The direct sense AMP circuit transmits read data loaded in a bit line pair including first and second bit lines to a data input/output line pair including first and second data input/output lines in response to a read command signal. The input/output gate circuit, in response to a read/write signal, passes the read data loaded in the bit line pair to the data input/output line pair and passes write data loaded in the data input/output line pair to the bit line pair. The operation control unit, in response to a column address signal and a write command, generates the read command signal and the read/write signal to turn ON both the direct sense AMP circuit and the input/output gate circuit in a data read operation or generates the read command signal and the read/write signal to turn ON the input/output gate circuit and turn OFF the direct sense AMP circuit in a data write operation.

The operation control unit generates the read command signal and the read/write signal at a first level in a data read operation or generates the read command signal at a second level and the read/write signal at the first level in a data write operation.

The operation control unit generates both the read command signal and the read/write signal at the first level when the column address signal has the first level and the write command has the second level or generates the read command signal at the second level and the read/write signal at the first level when both the column address signal and the write command have the first level.

According to another aspect of the present invention, the circuit comprises a direct sense AMP circuit and an input/output gate circuit. The direct sense AMP circuit is turned fully ON (in response to a read/write signal) in a data read operation, and transmits read data loaded in a bit line pair including first and second bit lines to a data input/output line pair including first and second data input/output lines, but is turned OFF in response to the write block signal in a data write operation. The input/output gate circuit passes the read data loaded in the bit line pair to the data input/output line pair in response to the read/write signal in the data read operation and passes write data loaded in the data input/output line pair to the bit line pair in response to the read/write signal in the data write operation. The read/write signal is a column address signal.

The write block signal is generated at a first level in a data read operation and at a second level in a data write operation. The write block signal is generated by a write command with an address signal.

According to yet another aspect of the present invention, the circuit comprises a direct sense AMP circuit component, an input/output gate circuit, and a write/read control unit. The direct sense AMP circuit component is turned ON in response to a read/write signal and transmits read data loaded in a bit line pair including first and second bit lines to a data input/output line pair including first and second data input/output lines. The input/output gate circuit also passes the read data loaded in the bit line pair in response to the read/write signal in the data read operation to the data input/output line pair and passes write data loaded in the data input/output line pair to the bit line pair in response to the read/write signal in the data write operation. The write/read control unit passes the read data generated from the direct sense AMP circuit component to the data input/output line pair in response to a write block signal in the data read operation and blocks the connection between the direct sense AMP circuit component and the data input/output line pair in the data write operation.

The write/read control unit comprises a first block transistor and a second block transistor. The first block transistor has a first end connected to the first data input/output line, a gate connected to the write block signal, and a second end connected to the direct sense AMP circuit component. The second block transistor has a first end connected to the second data input/output line, a gate connected to the write block signal, a second end connected to the direct sense AMP circuit component.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE PREFERRED EMBODIMENTS

The present invention now will be described more fully with reference to the accompanying drawings, in which preferred embodiments of the invention are shown.

Figure 1:
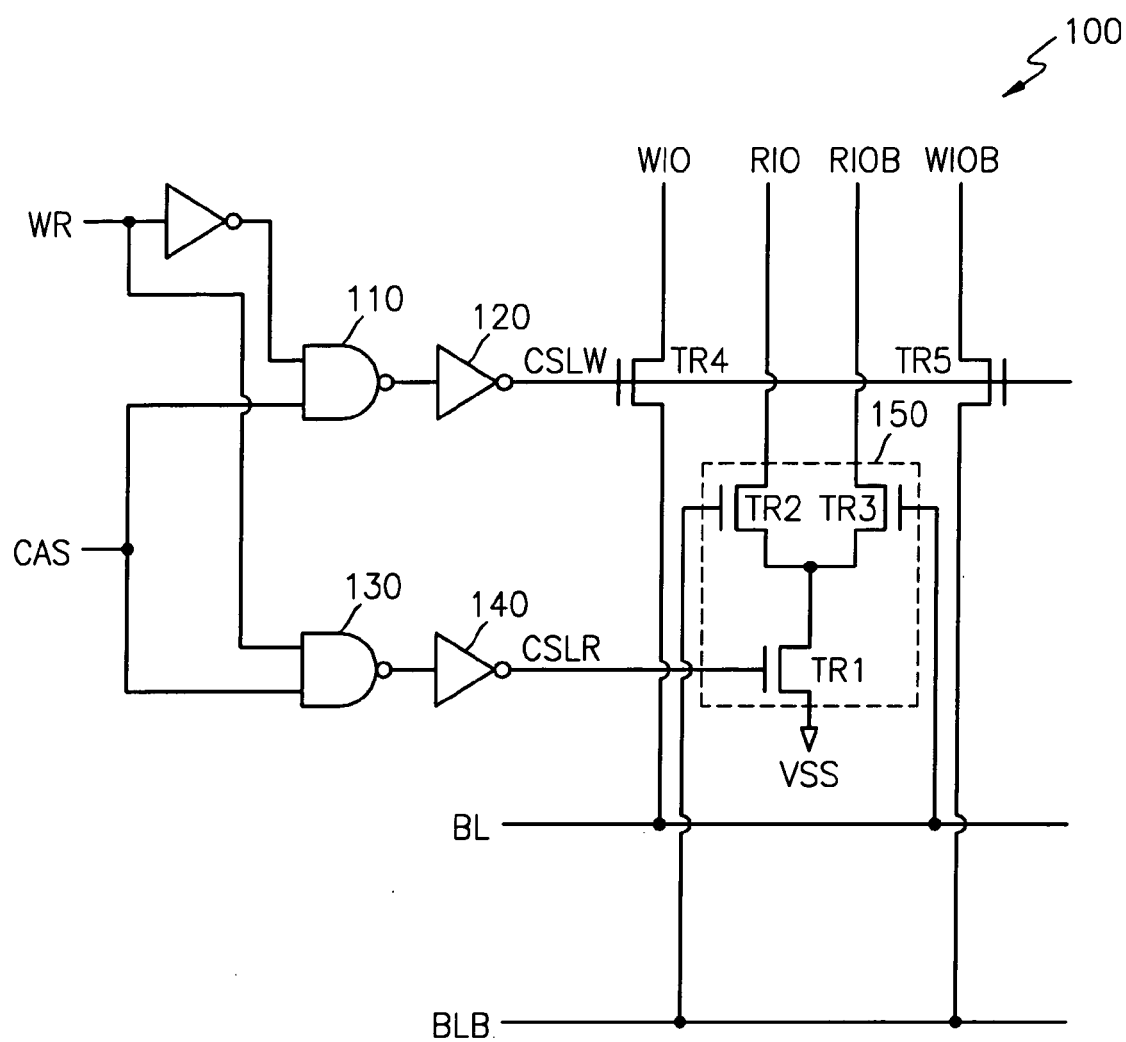
FIG. 1 is a circuit diagram of a conventional circuit including a sense AMP that connects a data input/output pair to a bit line pair.
Figure 2:
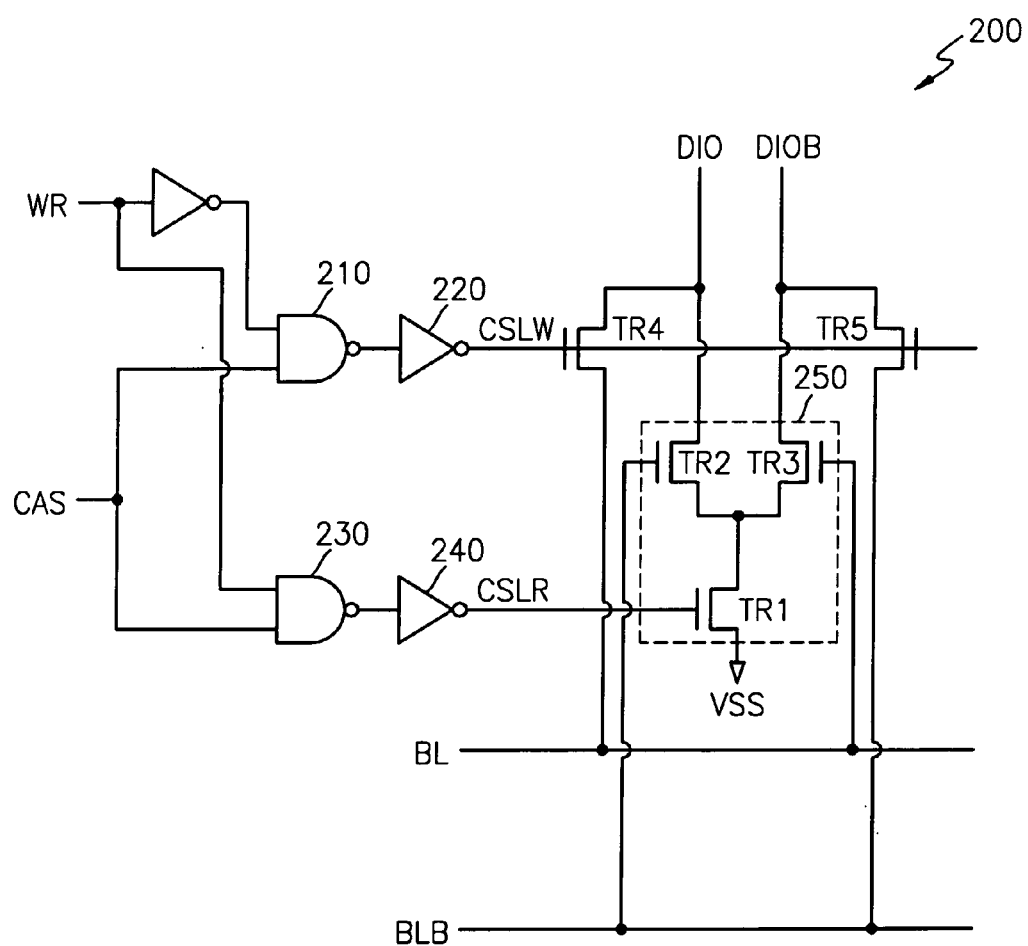
FIG. 2 is a circuit diagram of another conventional circuit including a sense AMP that connects a data input/output line pair to a bit line pair.
Figure 3:
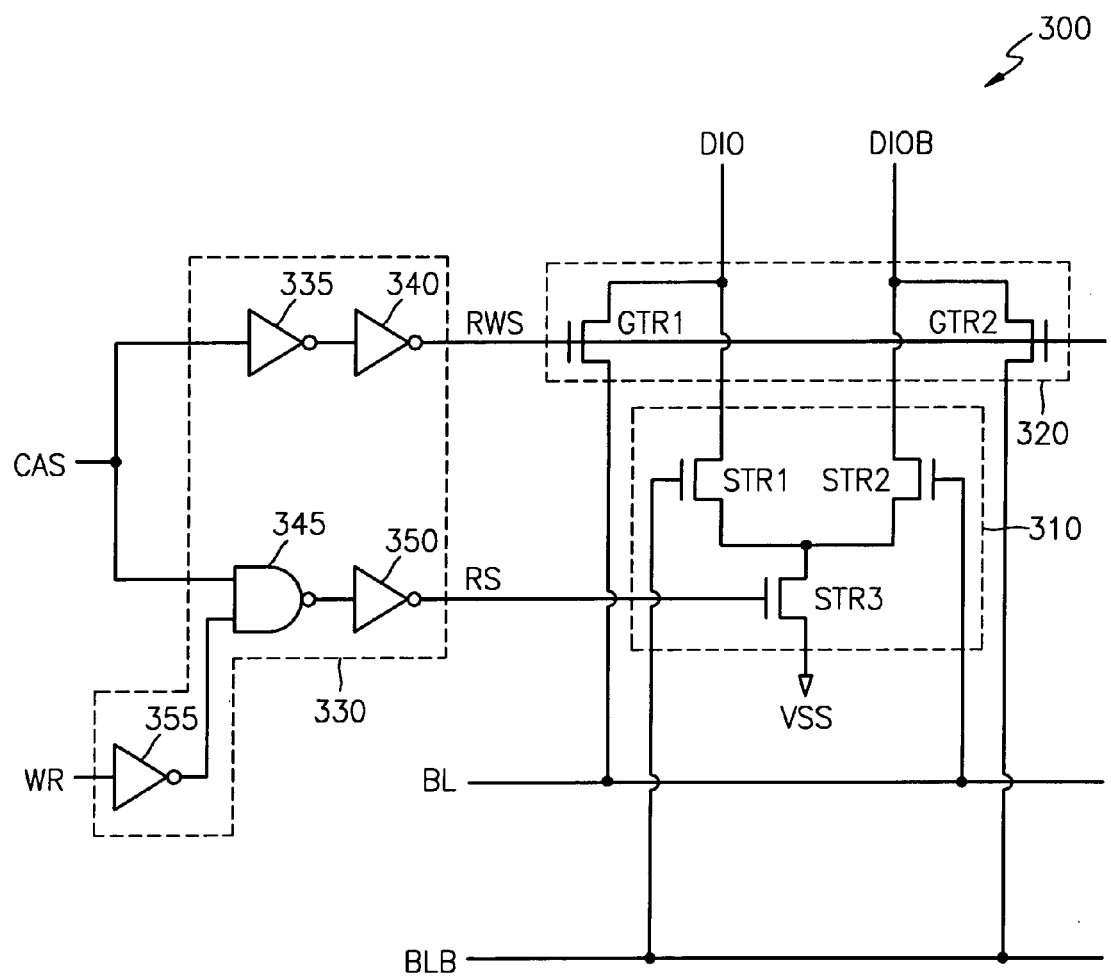
FIG. 3 is a circuit diagram of a circuit according to an embodiment of the present invention.

FIG. 3 is a circuit diagram of a memory device (circuit) according to a first embodiment of the present invention. Persons skilled in the art will recognize that the device can be constructed on a semiconductor using Metal Oxide Semiconductor (MOS) transistors, or with other forms of electrically operated ON/OF switches. The term "transistor" as used herein includes any form of ON/OFF switch which may be adapted by persons skilled in the art to perform the operation of the circuit disclosed herein.

Referring to FIG. 3, a memory device 300 according to a first embodiment of the present invention includes a direct sense AMP circuit 310, an input/output gate circuit 320, and an operation control unit 330. The direct sense AMP circuit 310 transmits read data in a bit line pair including first and second bit lines BL and BLB to a data input/output line pair including first and second data input/output lines DIO and DIOB in response to a read command signal RS.

The direct sense AMP circuit 310 includes first through third sense transistors STR1, STR2, and STR3. The first sense transistor STR1 has a first end which is connected to the first data input/output line DIO and a gate which is connected to the second bit line BLB. The "gate" of each of the transistors (switches) is an electrode that receives a voltage signal that activates (turns ON; conducting) or inactivates (turns OFF; non-conducting) the switch between the first and second ends of each transistor (switch).

The second sense transistor STR2 has a first end which is connected to the second data input/output line DIOB and a gate which is connected to the first bit line BL.

The third sense transistor STR3 has a first end which is connected to second ends of the first sense transistor STR1 and the second sense transistor STR2, a second end which is connected to a ground voltage VSS, and a gate which is connected to the read command signal RS. The first through third sense transistors STR1, STR2, and STR3 are N-type switches (e.g., NMOS transistors).

The input/output gate circuit 320 passes the read data loaded in the bit line pair BL and BLB to the data input/output line pair DIO and DIOB or transmits write data in the data input/output line pair DIO and DIOB to the bit line pair BL and BLB in response to a read/write signal RWS.

The input/output gate circuit 320 includes first and second transistors GTR1 and GTR2. The first transistor GTR1 has a first end which is connected to the first data input/output line DIO, a second end which is connected to the first bit line BL, and a gate to which the read/write signal RWS is applied.

The second transistor GTR2 has a first end which is connected to the second data input/output line DIOB, a second end which is connected to the second bit line BLB, and a gate to which the read/write signal RWS is applied.

The first and second transistors GTR1 and GTR2 are N-type switches (e.g., NMOS transistors).

In a data read operation, the operation control unit 330 activates the read (command) signal RS and the read/write signal RWS in response to a column address signal CAS and a write command WR and thus turns ON both the direct sense AMP circuit 310 and the input/output gate circuit 320. In a data write operation, the operation control unit 330 inactivates the read command signal RS and activates the read/write signal RWS, turning ON the input/output gate circuit 320, and turning OFF the direct sense AMP circuit 310.

Hereinafter, operations of the memory device according to an embodiment of the present invention will be further described with reference to FIG. 3.

In the data read operation, the operation control unit 330 generates the read command signal RS and the read/write signal RWS at a first level. In the data write operation, the operation control unit 330 generates the read command signal RS at a second level and the read/write signal RWS at the first level.

In embodiments of the invention, such as the embodiments illustrated herein, wherein the transistors employed are N-type (e.g., NMOS transistors) the first level is a high level and the second level is a low level. However, it will be understood by those skilled in the art that in other embodiments of the invention (e.g., using P-type switches), the first level can be the low level and the second level can be the high level.

In FIG. 3, the operation control unit 330 includes inverters 335, 340, 350, and 355, and a NAND gate 345. However, it will be understood by those skilled in the art that the operation control unit 330 may have another configuration so long as it has the same functions as the operation control unit 330 of FIG. 3.

In order to generate the read command signal RS and the read/write signal RWS at the first (high) level in the data read operation, the column address signal CAS is generated at the first (high) level, and the write command WR is generated at the second (low) level.

Thus, in the data read operation, the column address signal CAS is generated at a high level, and the write command WR is generated at a low level so that the read command signal RS and the read/write signal RWS are generated at a high level to activate both the direct sense AMP circuit 310 and the input/output gate circuit 320. Thus, the first and second transistors GTR1 and GTR2 of the input/output gate circuit 320 are turned ON, and the third sense transistor STR3 of the direct sense AMP circuit 310 is turned ON.

The conducting state (e.g., ON or OFF) of each of the first sense transistor STR1 and the second sense transistor STR2 will be controlled by the level of the voltage on the first and second bit lines, respectively. If the read data having a high level is in the first bit line BL, and the read data having a low level is in the second bit line BLB, the read data having a low level is transmitted to the second data input/output line DIOB, and the read data having a high level is transmitted to the first input/output line DIO via the first sense transistor STR1 and the second sense transistor STR2 respectively. If the read data having a low level is in the first bit line BL, and the read data having a high level is in the second bit line BLB, the read data having a high level is transmitted to the second data input/output line DIOB, and the read data having a low level is transmitted to the first input/output line DIO via the first sense transistor STR1 and the second sense transistor STR2 respectively.

The read data on the first bit line BL is also transmitted to the first data input/output line DIO through the first transistor GTR1. The read data on the second bit line BLB is also transmitted to the second data input/output line DIOB through the second transistor GTR2.

In a data read operation, since both the direct sense AMP circuit 310 and the input/output gate circuit 320 are turned ON (in response to the read command signal RS and the read/write signal RWS), the level (high or low) of the read data transmitted to the data input/output line pair DIO and DIOB can be accurately estimated without malfunction even when the supply voltage of a memory device (circuit) 300 is lowered.

In the data write operation, the read command signal RS is generated at the second (low) level, and the read/write signal RWS is generated at the first (high) level when both the column address signal CAS and the write command WR are generated at the first (high) level.

The read command signal RS is generated at the low level, the direct sense AMP circuit 310 is turned OFF. The read/write signal RWS is generated at the high level, and thus the first and second transistors GTR1 and GTR2 of the input/output gate circuit 320 are turned ON. Therefore, data input to the data input/output line pair DIO and DIOB is written to the bit line pair BL and BLB through the first and second transistors GTR1 and GTR2.

The third sense transistor STR3 of the direct sense AMP circuit 310 can be mounted between the first and second transistors STR1 and STR2 and the ground voltage VSS. Alternatively, a pair of parallel switches (e.g., STR3A and STR3B, not shown) can be used instead of the single third sense transistor STR3 so that each of the paths between the data input/output line pair DIO and DIOB and ground is separated. As the number of the third sense transistors STR3 increases (e.g., to two parallel switches (e.g., STR3A and STR3B, not shown), the driving ability of the direct sense AMP circuit 310 is improved.

In summary: In the data read operation of the memory device 300 of FIG. 3, both the direct sense AMP circuit 310 and the input/output gate circuit 320 are turned ON. In the data write operation, the direct sense AMP circuit 310 is turned OFF, and the input/output gate circuit 320 is turned ON.

Figure 4:
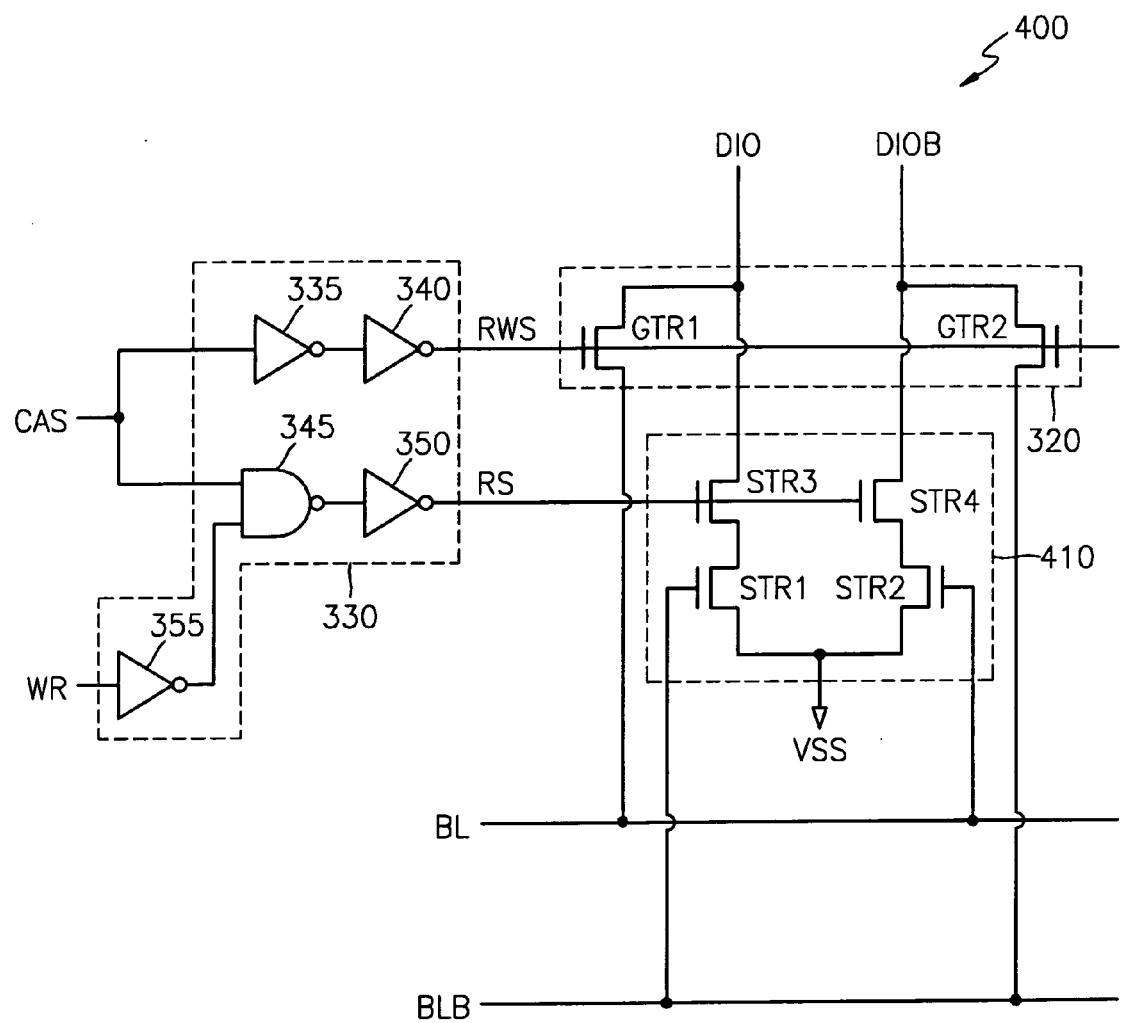
FIG. 4 is a circuit diagram of the circuit of FIG. 3 including another form of a direct sense AMP circuit.

FIG. 4 is a circuit diagram of another embodiment of the memory device (circuit) of FIG. 3 that includes another form of a direct sense AMP circuit.

Referring to FIG. 4, a direct sense AMP circuit 410 includes first through fourth sense transistors STR1, STR2, STR3, and STR4. The first sense transistor STR1, and third sense transistor STR3 are connected in a first (series) stack between to the first data input/output line DIO and ground voltage VSS. The second sense transistor STR2, and fourth sense transistor STR4 are connected in a second (series) stack between to the second data input/output line DIOB and ground voltage VSS.

The first sense transistor STR1 has a first end which is connected to the ground voltage VSS and a gate which is connected to the second bit line BLB. The second sense transistor STR2 has a first end which is connected to the ground voltage VSS and a gate which is connected to the first bit line BL. The third sense transistor STR3 has a first end which is connected to the second end of the first sense transistor STR1, a gate which is connected to the read command signal RS, and a second end which is connected to the first data input/output line DIO. The fourth sense transistor STR4 has a first end which is connected to the second end of the second sense transistor STR2, a gate which is connected to the read command signal RS, and a second end which is connected to the second data input/output line DIOB. The first through fourth sense transistors STR1, STR2, STR3, and STR4 are N-Type switches (e.g., NMOS transistors).

Compared to the direct sense AMP circuit 310 of FIG. 3, in the direct sense AMP circuit 410 of FIG. 4, the locations of the sense transistors STR3 and STR4 (each having the function of single sense transistor STR3 in FIG. 3) having the gate to which the read command signal RS is input are exchanged with the location of the sense transistors STR1 and STR2 having the gate to which the bit line pair BL and BLB is input.

By using the direct sense AMP circuit 410, the amplifying transistors STR1 and STR2 (which many be affected by the data levels on bit line pair BL and BLB), are fully electrically isolated from the data input/output line pair DIO and DIOB in the data write operation, and thus malfunction can be prevented from occurring.

Figure 5:
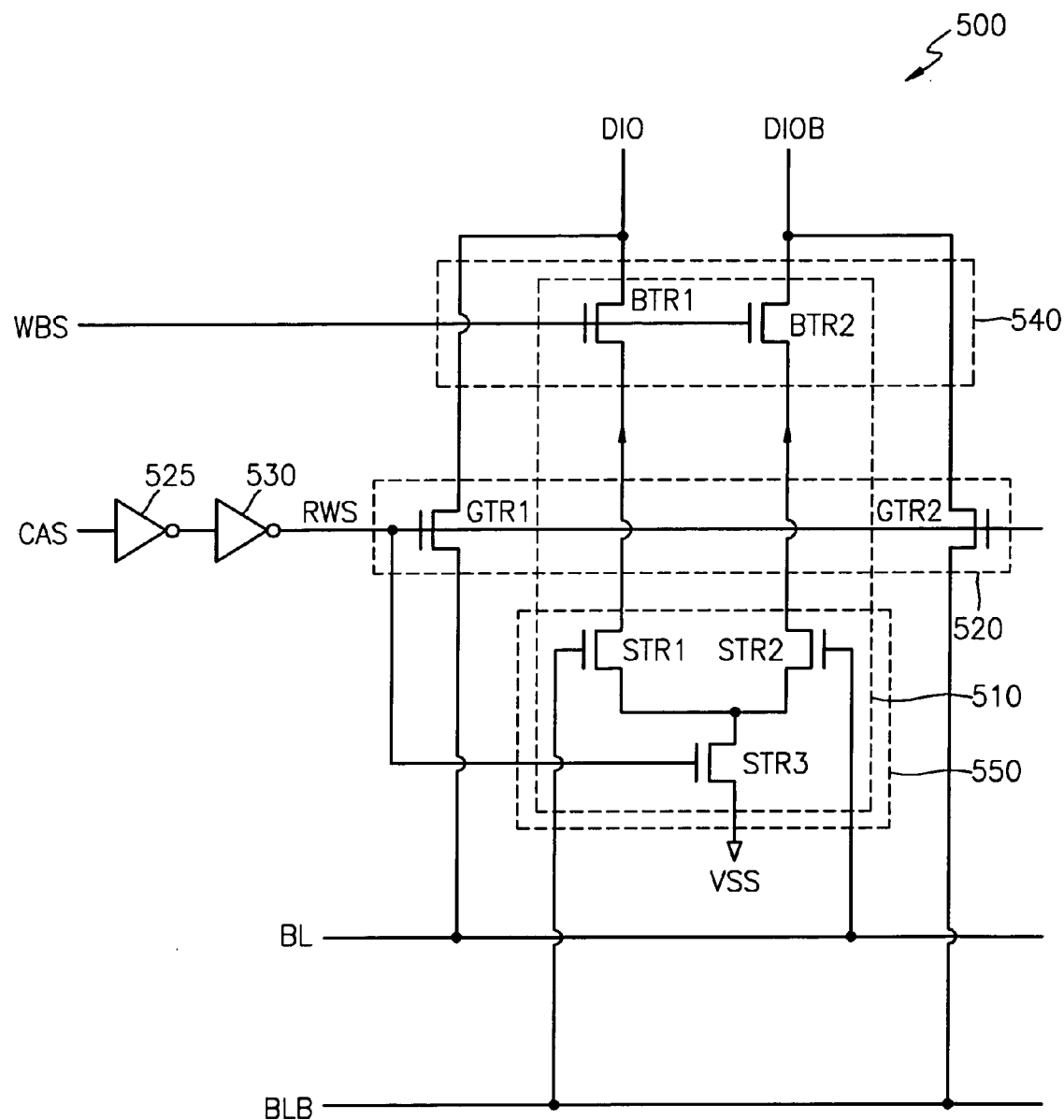
FIG. 5 is a circuit diagram of a circuit according to another embodiment of the present invention.

FIG. 5 is a circuit diagram of a memory device (circuit) according to another embodiment of the present invention.

Referring to FIG. 5, a memory device 500 according to another embodiment of the present invention includes a direct sense AMP circuit 510 that includes a first direct sense AMP circuit component 550 having the form of direct sense AMP circuit 310 of FIG. 3 and further includes a write/read control unit 540. The memory device 500 also comprises an input/output gate circuit 520 having the form of the input/output gate circuit 320 of FIG. 3.

In a data read operation, the direct sense AMP circuit 510 is turned ON in response to a write block signal WBS and a read/write signal RWS, transmits read data loaded in the bit line pair including the first and second bit lines BL and BLB to the data input/output line pair including the first and second data input/output lines DIO and DIOB. In the data write operation, the direct sense AMP circuit 510 is turned OFF in response to the write block signal WBS.

The direct sense AMP circuit 510 includes a first block transistor BTR1 and a second block transistor BTR2 and first through third sense transistors STR1, STR2, and STR3.

The first sense transistor STR1 and a first block transistor BTR1 are connected by LINE1A in a first (series) stack between the first data input/output line DIO and a sense transistor (e.g., first sense transistor STR1) connected to ground voltage VSS. The second sense transistor STR2 and a second block transistor BTR2 are connected by LINE1B in a second (series) stack between the second data input/output line DIOB and a sense transistor (e.g., first sense transistor STR1) connected to ground voltage VSS. The first block transistor BTR1 has a first end which is connected to the first data input/output line DIO and a gate which is connected to the write block signal WBS. The second block transistor BTR2 has a first end which is connected to the second data input/output line DIOB and a gate which is connected to the write block signal WBS.

The first sense transistor STR1 has a first end which is connected to the second end of the first block transistor BTR1 and a gate which is connected to the second bit line BLB. The second sense transistor STR2 has a first end which is connected to the second end of the second block transistor BTR2 and a gate which is connected to the first bit line BL.

The third sense transistor STR3 has a first end which is connected to second ends of the first sense transistor STR1 and the second sense transistor STR2, a second end which is connected to the ground voltage VSS, and a gate which is connected to the read/write signal RWS. The first and second block transistors BTR1 and BTR2, and the first through third sense transistors STR1, STR2, and STR3 are N-type switches (e.g., NMOS transistors).

The read/write signal RWS is a column address signal CAS. The write block signal WBS is generated at a first (high) level in the data read operation and is generated at a second (low) level in the data write operation. The write block signal WBS is generated by combining a write command (not shown) with an address signal (not shown).

In the data read operation, the input/output gate circuit 520 is activated in response to the read/write signal RWS (CAS) and transmits the read data loaded in the bit line pair BL and BLB to the data input/output line pair DIO and DIOB via LINE2A and LINE2B, respectively. In the data write operation, the input/output gate circuit 520 is activated in response to the read/write signal RWS (CAS) and transmits the write data in the data input/output line pair DIO and DIOB to the bit line pair BL and BLB via LINE2A and LINE2B, respectively.

The input/output gate circuit 520 includes first and second transistors GTR1 and GTR2. The first transistor GTR1 has a first end which is connected to the first data input/output line DIO, a second end which is connected to the first bit line BL, and a gate which is connected to the read/write signal RWS. The second transistor GTR2 has a first end which is connected to the second data input/output line DIOB, a second end which is connected to the second bit line BLB, and a gate which is connected to the read/write signal RWS.

Hereinafter, the operations of the memory device 500 will be further described with reference to FIG. 5.

The memory device 500 of FIG. 5 does not have a read/write signal RWS separate from a read command signal RS and has only a read/write signal RWS in contrast with the memory devices 300 and 400 of FIGS. 3 and 4.

Therefore, if the read/write signal RWS, (i.e., the column address signal CAS), is input at the first (high) level, then, regardless of whether the operation is a data read operation or a data write operation, the first direct sense AMP circuit component 550 and an input/output gate circuit 520 are turned ON. In the present embodiment wherein the switches used are N-type switches (e.g., NFETs), the first level is a high level.

In the data read operation, if the read/write signal RWS is applied to the direct sense AMP circuit 510 and to the input/output gate circuit 520 at the high level and the write block signal WBS is applied to the first and second block transistors BTR1 and BTR2 at the high level, and so the direct sense AMP circuit 510 and the input/output gate circuit 520 are both activated and both transmit the read data to the data input/output line pair DIO and DIOB at the same time.

Since operations of transmitting the read data to the data input/output line pair DIO and DIOB have been already described, detailed descriptions thereof will be omitted.

In the write operation, the write block signal WBS is input to the first and second block transistors BTR1 and BTR2 of the second component 540 of the direct sense AMP circuit 510 at the low level, and thus the first and second block transistors BTR1 and BTR2 are turned OFF. The write block signal WBS is generated by the address signal (not shown), which is used to indicate a memory cell where the write data is written, and a write command (not shown), which is used to command the data write operation.

In the data write operation, the read/write signal RWS is applied to the first component 550 of the direct sense AMP circuit 510 and to the input/output gate circuit 520 at the high level. Therefore, the amplified outputs of the first component 550 of the direct sense AMP circuit 510 on LINE1A and LINE1B are blocked from the data input/output line pair DIO and DIOB by the first and second block transistors BTR1 and BTR2 which are turned OFF in response to the write block signal WBS even though the first component 550 of the direct sense AMP circuit 510 and the input/output gate circuit 520 are turned ON.

Therefore, in the data write operation, the write data input to the data input/output line pair DIO and DIOB is transmitted to the bit line pair BL and BLB only through the first and second transistors GTR1 and GTR2 of the data input/output gate circuit 520.

Figure 6:
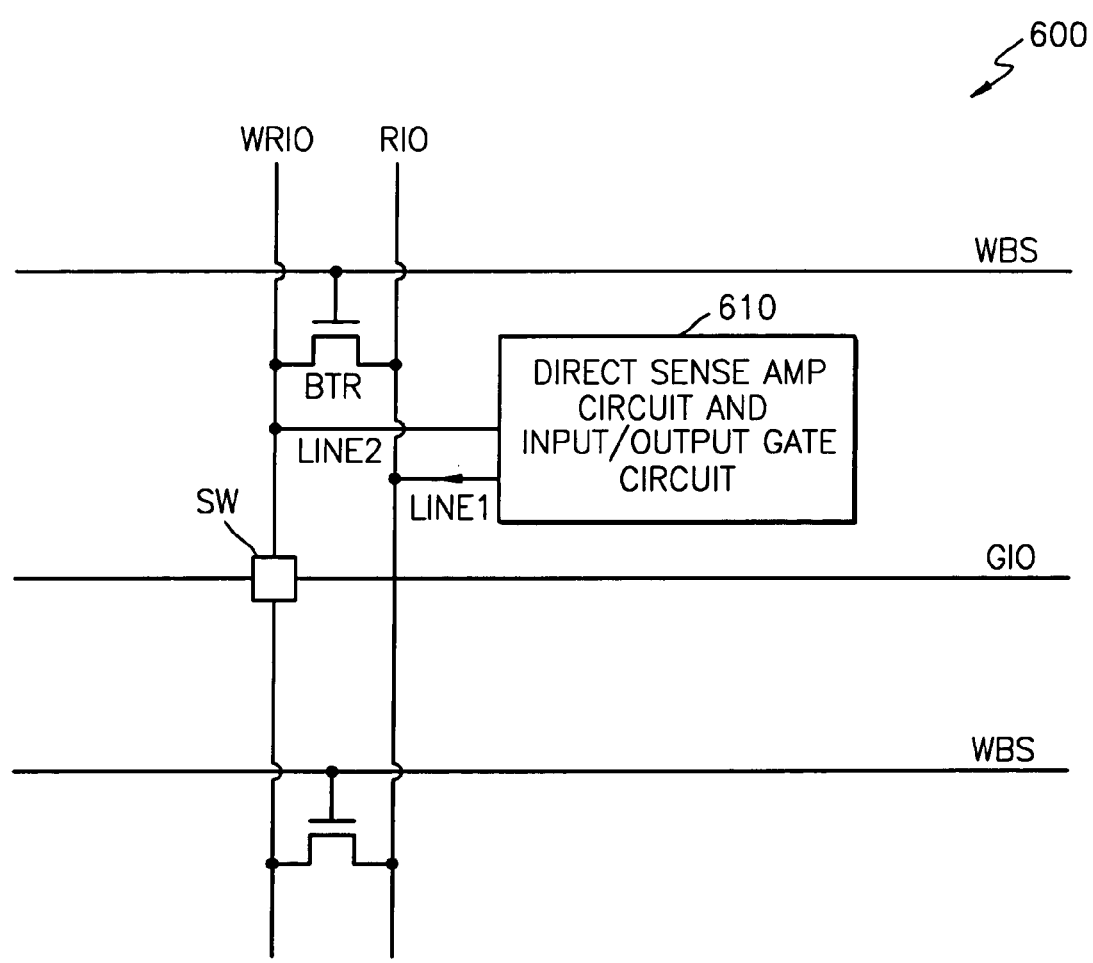
FIG. 6 is a simplified circuit diagram for explaining the operation of a data input line and a data output line when the circuit of FIG. 5 is used.

FIG. 6 is a simplified circuit diagram for explaining the operation of a pair of data lines LINE1 and LINE2 (e.g., one of pair LINE1A-LINE2A or pair LINE1B-LINE2B) when the memory device of FIG. 5 is used.

In general, the data input/output line can be classified into a local data input/output line and a global input/output line. The data read from the memory cell is output to outside the device 500 through the local data input/output line and the global data input/output line.

In FIG. 6, GIO denotes the global data input/output line; WRIO and RIO denote the local data input/output line. The first direct sense AMP circuit component 550 and the an input/output gate circuit 520 of memory device 500 of FIG. 5 are referred to as 610 in FIG. 6. The write blocking transistor BTR of FIG. 6 is represents one of the first and second block transistors BTR1 and BTR2.

WRIO denotes a data transmission line which is connected to the input/output gate circuit 520 of FIG. 5 (via one of LINE2A and LINE2B) and through which data is transmitted in the data read operation and the data write operation. RIO denotes a data transmission line which is connected to the direct sense AMP circuit 510 of FIG. 5 (via one of LINE1A and LINE1B) and through which data is transmitted in the data read operation.

A transistor BTR is connected between RIO (e.g., LINE1A or LINE1B BTR2 of FIG. 5) and WRIO (LINE2A or LINE2B BTR2 of FIG. 5) and connected or disconnected according to the logic level of the write block signal WBS.

In the data read operation, the write block signal WBS is applied to the transistor BTR at the high level, and the transistor BTR is turned ON. The read data read from the direct sense AMP circuit 510 of FIG. 5 is applied to GIO through a switch SW sequentially via a first line LINE1 (e.g., LINE1A or LINE1B BTR2 of FIG. 5), RIO, the transistor BTR, and WRIO.

The read data read from the input/output gate circuit 520 of FIG. 5 is connected to GIO through a second line LINE2 (e.g., LINE2A or LINE2B BTR2 of FIG. 5), WRIO, and the switch SW.

In the data write operation, the write block signal WBS is applied to the transistor BTR at the low level, and the transistor BTR (e.g., BTR1 or BTR2 of FIG. 5) is turned OFF. The input data input from the GIO is applied to the input/output gate circuit 520 of FIG. 5 through the switch SW and the second line LINE2 (e.g., LINE2A or LINE2B BTR2 of FIG. 5). Since the transistor BTR is turned off, the input data is not applied to the first component 550 of the direct sense AMP circuit 510 of FIG. 5 (contained within 610 of FIG. 6).

A memory device (circuit) according to another embodiment of the present invention will be described with reference to FIG. 5.

The memory device according to another embodiment of the present invention includes a first direct sense AMP circuit component 550, and a write/read control unit 540 (the second component of direct sense AMP circuit 510), and an input/output gate circuit 520.

In response to the write block signal WBS, the write/read control unit 540 transmits the read data generated from the first component 550 of the direct sense AMP circuit 510 to the data input/output line pair DIO and DIOB in the data read operation, or blocks connection between the first component 550 of the direct sense AMP circuit 510 and the data input/output line pair DIO and DIOB in the data write operation.

More specifically, the write/read control unit 540 includes first and second block transistors BTR1 and BTR2. The first block transistor BTR1 has a first end which is connected to the first data input/output line DIO, a gate which is connected to the write block signal WBS, and a second end which is connected to the first end of the first sense transistor STR1 within the first component 550 of the direct sense AMP circuit.

The second block transistor BTR2 has a first end which is connected to the second data input/output line DIOB, a gate which is connected to the write block signal WBS, and a second end which is connected to the first end of the second sense transistor STR2 within first component 550 of the direct sense AMP circuit 510.

The first component 550 of the direct sense AMP circuit 510 is turned ON in response to the read/write signal RWS and transmits the read data loaded in the bit line pair including the first and second bit lines BL and BLB to the data input/output line pair including the first and second data input/output lines DIO and DIOB.

More specifically, the first component 550 of the direct sense AMP circuit 510 includes first through third sense transistors STR1, STR2, and STR3. The first sense transistor STR1 has a first end which is connected to the second end of the first block transistor BTR1 and a gate which is connected to the second bit line BLB.

The second sense transistor STR2 has a first end which is connected to the second end of the second block transistor BTR2 and a gate which is connected to the first bit line BL. The third sense transistor STR3 has a first end which is connected to second ends of the first sense transistor STR1 and the second sense transistor STR2, and a second end which is connected to the ground voltage VSS, and a gate which is connected to the read/write signal RWS.

The first and second block transistors BTR1 and BTR2 and the first through third sense transistors STR1, STR2, and STR3 are N-type switches (e.g., NMOS transistors).

In the data read operation, the input/output gate circuit 520 transmits the read data loaded in the bit line pair BL and BLB to the data input/output line pair DIO and DIOB in response to the read/write signal RWS. In the data write operation, the input/output gate circuit 520 transmits the write data in the data input/output line pair DIO and DIOB to the bit line pair BL and BLB in response to the read/write signal RWS.

The input/output gate circuit 520 includes the first and second transistors GTR1 and GTR2. The first transistor GTR1 has a first end which is connected to the first data input/output line DIO, a second end which is connected to the first bit line BL, and a gate which is connected to the read/write signal RWS.

The second transistor GTR2 has a first end which is connected to the second data input/output line DIOB, a second end which is connected to the second bit line BLB, and a gate which is connected to the read/write signal RWS.

The first and second transistors GTR1 and GTR2 are N-type switches (e.g. NMOS transistors).

A memory device (circuit) according to yet another embodiment of the present invention has the same configuration as the memory device 500 described above, and includes a write/read control unit 540. The write/read control unit 540 includes the first and second block transistors BTR1 and BTR2 which are controlled in response to the write block signal WBS. Operations of the first and second block transistors BTR1 and BTR2 have been already described. Therefore, their detailed descriptions will be omitted.

According to the methods and structures of the memory device of the present invention, both a data transmission line and a data write line of a direct sense AMP circuit are activated at the same time during a read data operation, and thus it is optimized to perform a data read operation even when a supply voltage is low.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A circuit for use in a semiconductor memory, the device comprising:
    a direct sense AMP circuit for transmitting read data loaded in a bit line pair including first and second bit lines to a data input/output line pair including first and second data input/output lines in response to a read command signal;
    an input/output gate circuit for transmitting the read data loaded in the bit line pair to the data input/output line pair and for transmitting write data loaded in the data input/output line pair to the bit line pair, in response to a read/write signal;
    wherein an operation control unit for generating the read command signal and the read/write signal to turn ON both the direct sense AMP circuit and the input/output gate circuit in response to a column address signal and a write command in a data read operation, and for generating the read command signal and the read/write signal to turn ON the input/output gate circuit and to turn OFF the direct sense AMP circuit in a data write operation.

2. The circuit of claim 1, wherein the operation control unit generates the read command signal and the read/write signal at a first level in a data read operation and generates the read command signal at a second level and the read/write signal at the first level in a data write operation.

3. The circuit of claim 1, wherein the operation control unit generates both the read command signal and the read/write signal at the first level when the column address signal has the first level and the write command has the second level; and generates the read command signal at the second level and the read/write signal at the first level when both the column address signal and the write command have the first level.

4. A circuit for use in a semiconductor memory, the device comprising:
    a direct sense AMP circuit for transmitting read data loaded in a bit line pair including first and second bit lines to a data input/output line pair including first and second data input/output lines in response to a read command signal;
    an input/output gate circuit for transmitting the read data loaded in the bit line pair to the data input/output line pair and for transmitting write data loaded in the data input/output line pair to the bit line pair, in response to a read/write signal, wherein the input/output gate circuit comprises:
    a first transistor having a first end connected to the first data input/output line, a second end connected to the first bit line, and a gate to which the read/write signal is applied; and
    a second transistor having a first end connected to the second data input/output line, a second end connected to the second bit line and a gate to which the read/write signal is applied;
    and wherein the direct sense AMP circuit comprises:
    a first sense transistor having a first end connected to the first data input/output line and a gate connected to the second bit line;
    a second sense transistor having a first end connected to the second data input/output line and a gate connected to the first bit line; and
    a third sense transistor having a first end connected to second ends of the first sense transistor and the second sense transistor, a second end connected to a ground voltage, and a gate connected to the read command signal.

5. The memory circuit of claim 4, wherein at least one of the following is true: the first and second transistors are NMOS transistors; and the first through third sense transistors are NMOS transistors.

6. A circuit for use in a semiconductor memory, the device comprising:
    a direct sense AMP circuit for transmitting read data loaded in a bit line pair including first and second bit lines to a data input/output line pair including first and second data input/output lines in response to a read command signal;
    an input/output gate circuit for transmitting the read data loaded in the bit line pair to the data input/output line pair and for transmitting write data loaded in the data input/output line pair to the bit line pair, in response to a read/write signal, wherein the direct sense AMP circuit comprises:
    a first sense transistor having a first end connected to a ground voltage and a gate connected to the second bit line;
    a second sense transistor having a first end connected to the ground voltage and a gate connected to the first bit line;
    a third sense transistor having a first end connected to a second end of the first sense transistor, a gate connected to the read command signal, and a second end connected to the first data input/output line; and
    a fourth sense transistor which has a first end connected to a second end of the second sense transistor, a gate connected to the read command signal, and a second end connected to the second data input/output line.

7. The memory circuit of claim 6, wherein the memory is a Random Access Memory (RAM) or a Read Only Memory (ROM), and wherein the first through fourth sense transistors are NMOS semiconductor transistors.

8. A sense amplifying circuit for use in a semiconductor memory, the circuit comprising:
    a direct sense AMP circuit adapted to transmit read data loaded in a bit line pair including first and second bit lines to a data input/output line pair including first and second data input/output lines when turned ON in response to a write block signal and a read/write signal in a data read operation, and which is turned OFF in response to the write block signal in a data write operation; and an input/output gate circuit for transmitting the read data loaded in the bit line pair to the data input/output line pair in response to the read/write signal during the data read operation; and for transmitting write data loaded in the data input/output line pair to the bit line pair in response to the read/write signal during the data write operation.

9. The circuit of claim 8, wherein the direct sense AMP circuit comprises:
a first block transistor having a first end connected to the first data input/output line and a gate connected to the write block signal;
a second block transistor having a first end connected to the second data input/output line and a gate connected to the write block signal;
a first sense transistor having a first end connected to a second end of the first block transistor and a gate connected to the second bit line;
a second sense transistor having a first end connected to a second end of the second block transistor and a gate connected to the first bit line; and
a third sense transistor having a first end connected to second ends of the first sense transistor and the second sense transistor, a second end connected to a ground voltage, and a gate connected to the read/write signal.

10. The circuit of claim 9, wherein the first and second block transistors and the first through third sense transistors are NMOS semiconductor transistors.

11. The device of claim 9, wherein the read/write signal is a column address signal.

12. The circuit of claim 9, wherein the write block signal is generated at a first level in a data read operation and at a second level in a data write operation.

13. The circuit of claim 9, wherein the write block signal is generated by combining a write command with an address signal.

14. The circuit of claim 8, wherein the direct sense AMP circuit comprises:
a first block transistor having a first end connected to the first data input/output line and a gate connected to the write block signal;
a second block transistor having a first end connected to the second data input/output line and a gate connected to the write block signal;
a first sense transistor having a first end connected to a second end of the first block transistor, and a gate connected to the second bit line;
a second sense transistor having a first end connected to a second end of the second block transistor, and a gate connected to the first bit line;
a third sense transistor having a first end connected to a second end of the first sense transistor, and a gate connected to the read command signal;
a fourth sense transistor having a first end connected to a second end of the second sense transistor, and a gate connected to the read command signal.

15. The circuit of claim 8, wherein the input/output gate circuit comprises:
a first transistor having a first end connected to the first data input/output line, a second end connected to the first bit line, and a gate connected to the read/write signal; and
a second transistor having a first end connected to the second data input/output line, a second end connected to the second bit line, and a gate connected to the read/write signal.

16. The circuit of claim 15, wherein the first and second transistors are NMOS transistors.

17. A sense amplifying circuit for use in a semiconductor memory, the circuit comprising:
a direct sense AMP circuit component adapted to transmit read data loaded in a bit line pair including first and second bit lines to a data input/output line pair including first and second data input/output lines, when turned ON in response to a read/write signal;
an input/output gate circuit adapted to pass the read data loaded in the bit line pair to the data input/output line pair in response to the read/write signal in the data read operation; and adapted to pass write data loaded in the data input/output line pair to the bit line pair in response to the read/write signal in the data write operation; and
a write/read control unit for passing the read data generated from the direct sense AMP circuit component to the data input/output line pair in response to a write block signal in the data read operation and for blocking connection between the direct sense AMP circuit component and the data input/output line pair in the data write operation.

18. The circuit of claim 17, wherein the write/read control unit comprises:
a first block transistor having a first end connected to the first data input/output line, a gate connected to the write block signal, and a second end connected to a first sense transistor in the direct sense AMP circuit component; and
a second block transistor having a first end connected to the second data input/output line, a gate connected to the write block signal, a second end connected to a second sense transistor in the direct sense AMP circuit component.

19. The circuit of claim 18, wherein the direct sense AMP circuit component comprises:
a first sense transistor having a first end connected to the second end of the first block transistor and a gate connected to the second bit line;
a second sense transistor having a first end connected to the second end of the second block transistor and a gate connected to the first bit line; and
a third sense transistor having a first end connected to second ends of the first sense transistor and the second sense transistor, a second end connected to a ground voltage, and a gate connected to the read/write signal.

20. The circuit of claim 19, wherein the first and second block transistors and the first through third sense transistors are NMOS transistors.

21. The circuit of claim 17, wherein the input/output gate circuit comprises:
a first transistor having a first end connected to the first data input/output line, a second end connected to the first bit line, and a gate connected to the read/write signal; and
a second transistor having a first end connected to the second data input/output line, a second end connected to the second bit line, and a gate connected to the read/write signal.

22. The circuit of claim 21, wherein the first and second transistors are NMOS transistors.

23. The circuit of claim 17, wherein the read/write signal is a column address signal, and the semiconductor memory is a Random Access Memory (RAM).

24. The circuit of claim 17, wherein the write block signal is generated at a first level in a data read operation and is generated at a second level in a data write operation.

25. The circuit of claim 17, wherein the write block signal is generated by combining a write command with an address signal.

26. The circuit of claim 17, wherein the semiconductor memory is a Read Only Memory (ROM).

* * * * *